United States Patent
Kashitani et al.

(10) Patent No.: US 6,796,022 B2
(45) Date of Patent: Sep. 28, 2004

(54) ELECTRONIC COMPONENT MOUNTING APPARATUS

(75) Inventors: Hisayoshi Kashitani, Ota (JP); Katsuyuki Seto, Ota (JP); Yoshiharu Fukushima, Oizumi-machi (JP)

(73) Assignees: Sanyo Electric Co., Ltd., Osaka (JP); Sanyo High Technology Co., Ltd., Gunma (JP)

( * ) Notice: Subject to any disclaimer, the term of this patent is extended or adjusted under 35 U.S.C. 154(b) by 104 days.

(21) Appl. No.: 10/108,989

(22) Filed: Mar. 29, 2002

(65) Prior Publication Data

US 2002/0148109 A1 Oct. 17, 2002

(51) Int. Cl.[7] ............................. H05K 3/30; H05K 13/00

(52) U.S. Cl. ............................. 29/740; 29/741; 29/743; 29/DIG. 44; 294/64.1; 294/2

(58) Field of Search ..................... 29/740, 741, 743, 29/834, 832, DIG. 44, 742; 901/40; 294/2, 64.1; 414/737, 752

(56) References Cited

U.S. PATENT DOCUMENTS

| | | | | |
|---|---|---|---|---|
| 5,758,410 A | * | 6/1998 | Asai et al. | 29/740 |
| 5,850,683 A | * | 12/1998 | Okazaki et al. | 29/740 |
| 6,266,873 B1 | * | 7/2001 | Kitamura et al. | 29/832 |
| 2002/0148108 A1 | * | 10/2002 | Seto et al. | 29/743 |
| 2002/0148109 A1 | * | 10/2002 | Kashitani et al. | 29/743 |

FOREIGN PATENT DOCUMENTS

| | | | | |
|---|---|---|---|---|
| EP | 1246520 | * | 2/2002 | 29/743 |
| JP | 2000-165096 | | 6/2000 | |

* cited by examiner

*Primary Examiner*—Minh Trinh
(74) *Attorney, Agent, or Firm*—Morrison & Foerster LLP

(57) ABSTRACT

An electronic component mounting apparatus has a pair of guides, a beam traveling along the guides and a mounting head placed on the beam. A first linear motor moves the beam along the guides, and a second linear motor moves the mounting head along the beam. A thermal insulating portion placed between the beam and the guides thermally insulates the two components from each other. Thermal conduction portions are placed on the fixed elements of the first and second linear motors. This configuration assures an accurate operation of the mounting apparatus by eliminating thermal deformations of their components.

8 Claims, 8 Drawing Sheets

ELECTRONIC COMPONENT MOUNTING APPARATUS

BACKGROUND OF THE INVENTION

1. Field of the Invention

The invention is directed to an electronic component mounting apparatus including a movable beam with a driving source, a mounting head placed on the beam so as to move along the beam, and a suction nozzle placed on the mounting head, which picks up an electronic component by suction and mounts it to a print board.

2. Description of the Related Art

The electronic component mounting apparatus of the conventional art is disclosed, for example, in a Japanese Laid-Open Patent Publication No. 2000-165096. In this publication, a mounting apparatus having two linear motor axes, each of which has a pair of component mounting heads, is disclosed. Four component mounting heads use suction to pick up electronic components from component supply units. The apparatus also performs a recognition operation for recognizing the component and a mounting operation for mounting the component to a circuit substrate. Some portions of these operations are performed simultaneously.

In the apparatus described above, when a linear motor is used as a driving source of the linear motor axis (beam), movable elements generate heat upon the operation of the linear motor. The generated heat is then transmitted to the beam. Therefore, the temperature of beam increases, causing the thermal deformation of the beam. There is also a possibility of deteriorated accuracy in positioning of the beam.

SUMMARY OF THE INVENTION

The invention is directed to an electronic component mounting apparatus free from thermal deformation of its components. The invention is also directed to a mounting apparatus with a cooling system, which is much simpler than conventional cooling systems, such as a water cooling system.

The invention provides an electronic component mounting apparatus including a pair of guides disposed substantially parallel to each other and a beam for moving along the pair of guides. A mounting head is disposed on the beam so as to move in the direction of the beam. A suction nozzle is disposed on the mounting head for picking up an electronic component by vacuum suction and for mounting the electronic component on a print board. A linear motor is included for driving the beam, which has a fixed element disposed on the guide and a movable element disposed on the beam. A heat-insulating portion is disposed between the beam and the movable element.

The invention also provides an electronic component mounting apparatus including a pair of guides disposed substantially parallel to each other and a beam disposed on the pair of the guides so as to move along the pair of guides. A mounting head is disposed on the beam so as to move in the same direction as the beam and mounts an electronic component on a print board. A linear motor is disposed which includes a fixed element disposed on the beam in the direction of the beam and a movable element connected to the mounting head. A thermal conduction portion, which has a thermal conductivity higher than a thermal conductivity of the beam, is disposed in the beam in the direction of the beam. In this configuration, the movable element couples with the fixed element to operate as the linear motor.

DETAILED DESCRIPTION OF THE INVENTION

Figure 1:
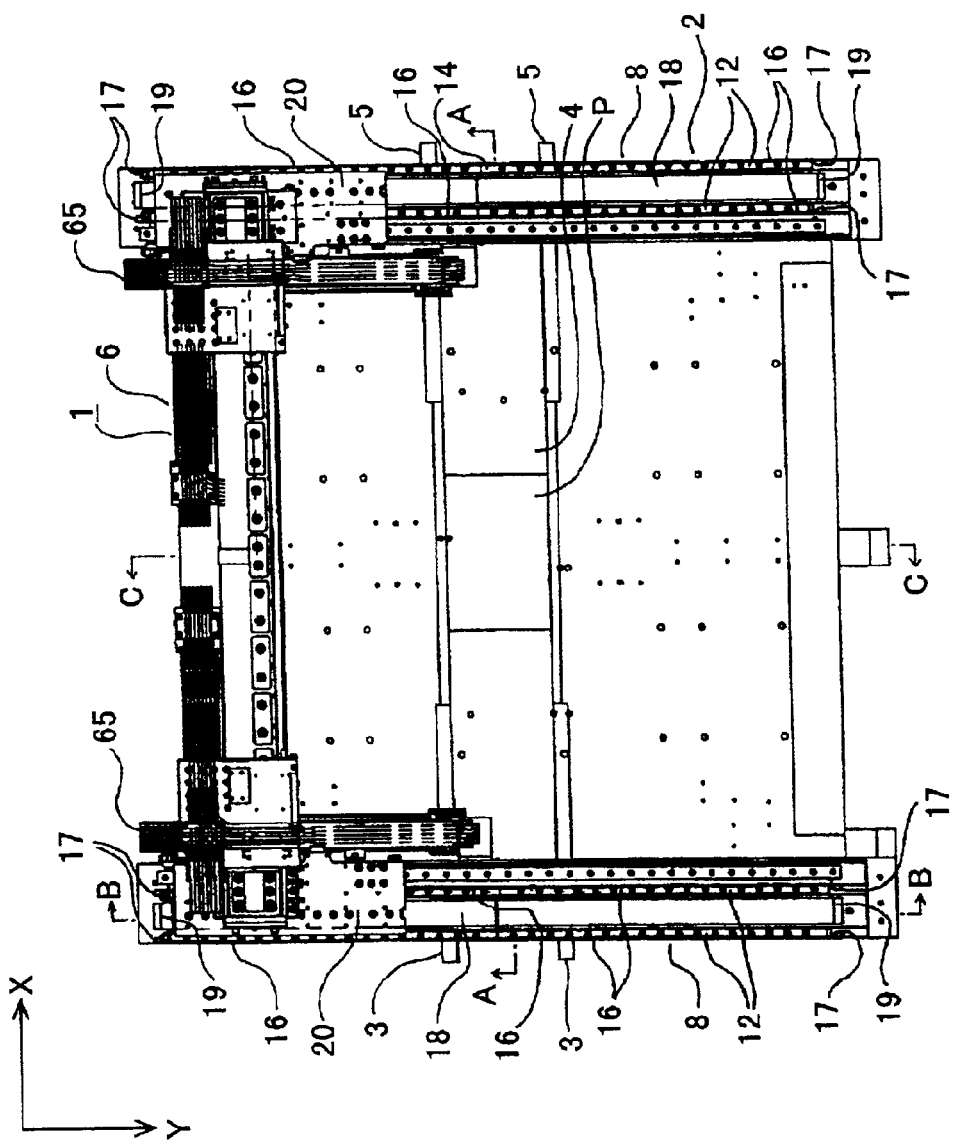
FIG. 1 is a plan view of the electronic component mounting apparatus of an embodiment of this invention.
Figure 2:
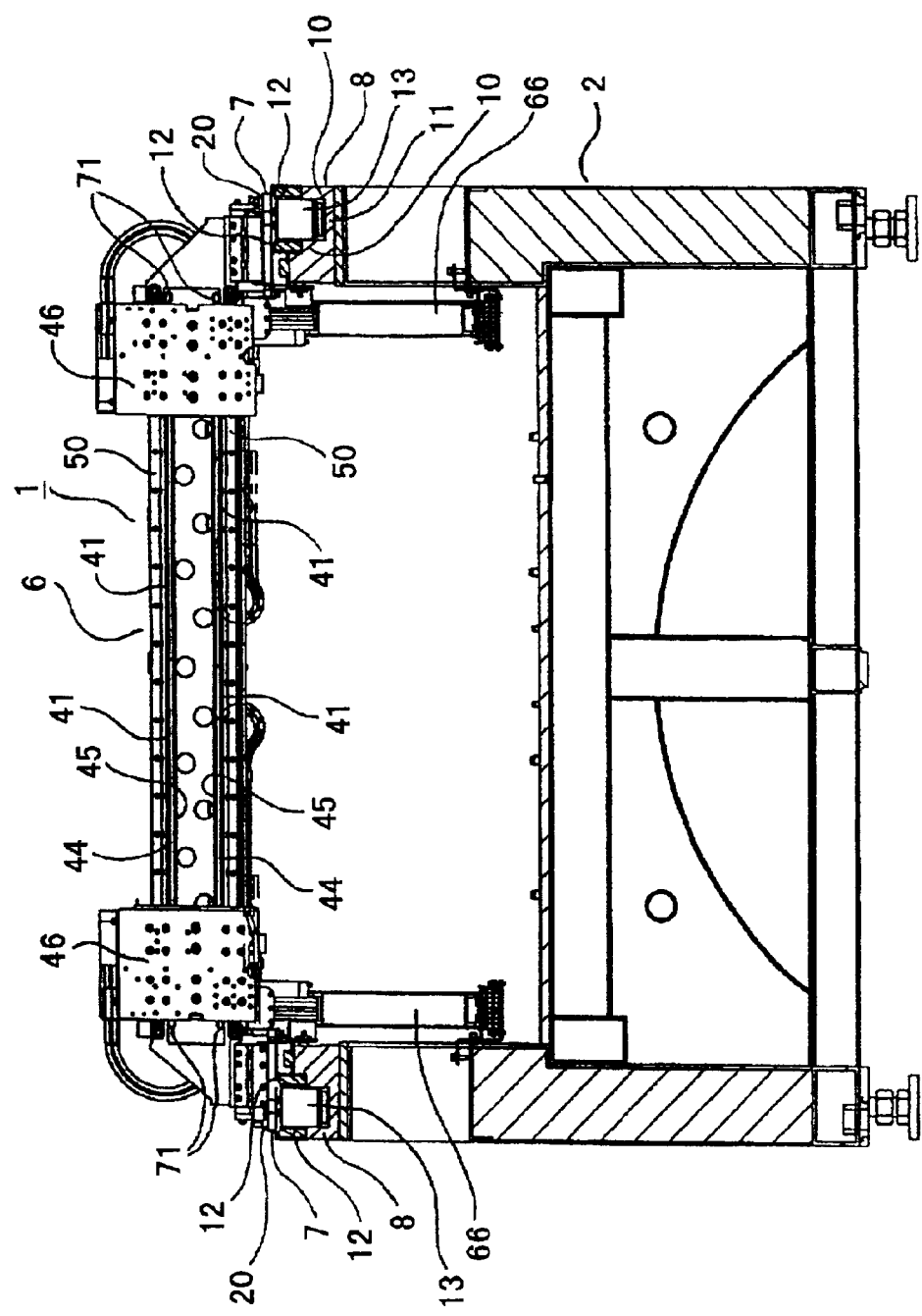
FIG. 2 is a schematic view of the cross-section of the electronic component mounting apparatus of FIG. 1 cut along the A—A line.

An embodiment of this invention will be explained by referring to the drawings above. FIG. 1 is a plan view of an electronic component mounting apparatus 1 of the embodiment and FIG. 2 shows the cross-sectional front view of the electronic component mounting apparatus 1. At both front and back sides of a base 2 of the electronic component mounting apparatus 1, a plurality of component supply units (not shown), which supply various kinds of electronic components one by one to a component pick-up portion (component suction position), are provided. Also, in the middle of the mounting apparatus 1, a supply conveyer 3 (omitted in FIGS. 2 and 4), a positioning portion 4 (omitted in FIGS. 2 and 6), and an exhausting conveyer 5 (omitted in FIG. 2) are provided so that a print board P moves in a lateral direction. The supply conveyer 3 receives the print board P from an upper stream and sends it to the positioning portion 4. The positioning portion 4 positions the print board P by using a positioning mechanism not shown in the figures. Then, after mounting the electronic component, the print board P is sent to the exhausting conveyer 5.

As shown in FIG. 1, reference numeral 6 denotes a beam extending in the X-direction. The print board P and an upper part of the component pick-up portion (component suction position) of the component supply unit move along a pair of guides 8 formed at right and left sides of the base 2 by driving a pair of Y-axis motors 7, 7, which are linear motors located at both sides (referred as the Y-axis linear motor, hereinafter) of base 2. The Y-axis linear motors 7, 7 have a pair of fixed elements 12, 12, formed on each of the guides 8, and a movable element 13. The guide 8 has a side wall 10 and a bottom wall 11 to leave a top portion open. The movable element 13 is made of iron or the like, and placed in each guide 8 between the fixed elements 12, 12. The Y-axis linear motors 7, 7, moves the beam 6. As seen from FIG. 3, the fixed elements 12, 12 are disposed facing each other in the longitudinal direction of the guide 8 with a space between them. The fixed element 12 comprises a base 14, fixed on an upper portion or an upper end of the side wall 10 of the guide 8, and a magnet 15, fixed on the base 14. There is a space between the magnet 15 and a side surface of the movable element 13 as well as between the sidewall 10 and the side surface of the movable element 13.

As shown in FIG. 1, reference numeral 16 denotes a thermal conduction portion 16 formed on each of the bases 14. The thermal conduction portion is divided into front and rear parts and covers almost the entire outer surface of the base 14. Also, the thermal conduction portion is a heat lane, which is made by bending and stacking a heat pipe made of aluminum or copper. Aluminum or copper has a higher thermal conductivity than that of iron, which is the preferred material used for the base 14 and the guide 8. The thermal conduction portion 16 is placed on a surface of the guide 8 with a high thermal conductivity adhesive. The front or rear end of the thermal conduction portions 16, have a bent portion 17, which is placed at a location out of the range of movement of the movable element 13. Bending and stacking the thermal conduction portion 16 in this manner can improve the thermal conduction. If grease with high thermal conductivity is placed between the thermal conduction portion 16 and the base 14, the thermal conduction between these two components is improved. Under this improved thermal conductivity, it is possible to attach the thermal conduction portion 16 to the base 14 by using a long metal board (not shown).

Figure 3:
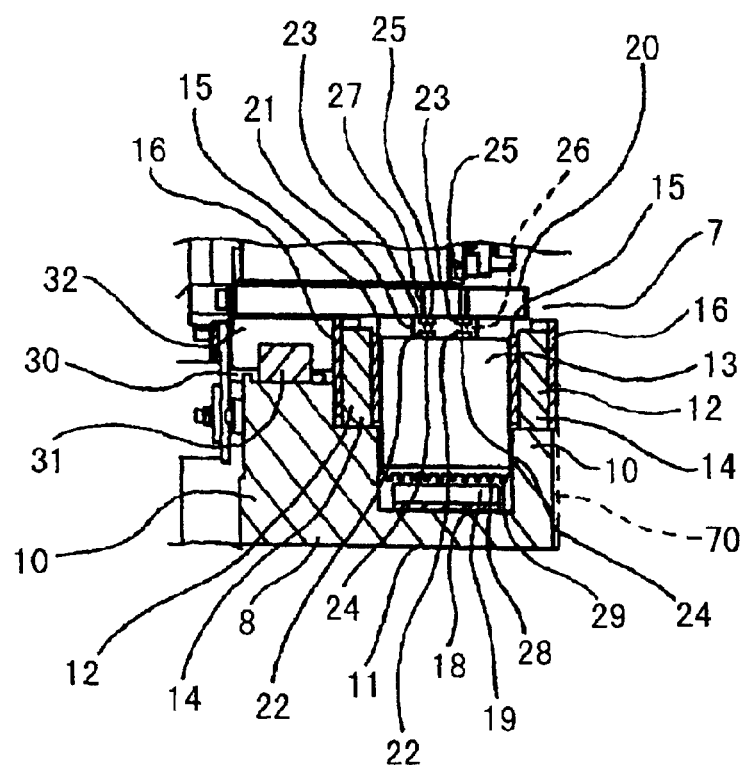
FIG. 3 is a partial enlarged view of FIG. 2 showing the cross-section of the upper right portion of the electronic component mounting apparatus.
Figure 4:
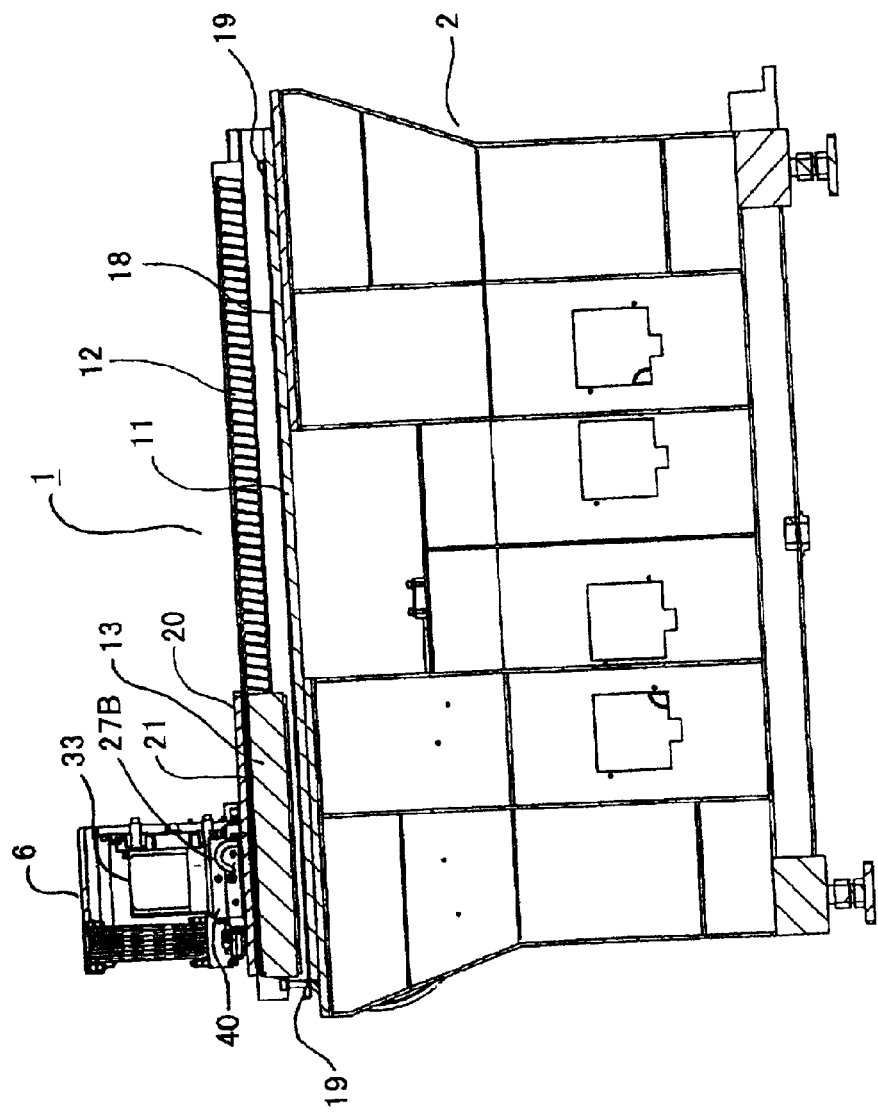
FIG. 4 is a schematic view of the cross-section of the electronic component mounting apparatus of FIG. 1 cut along the B—B line.
Figure 5:
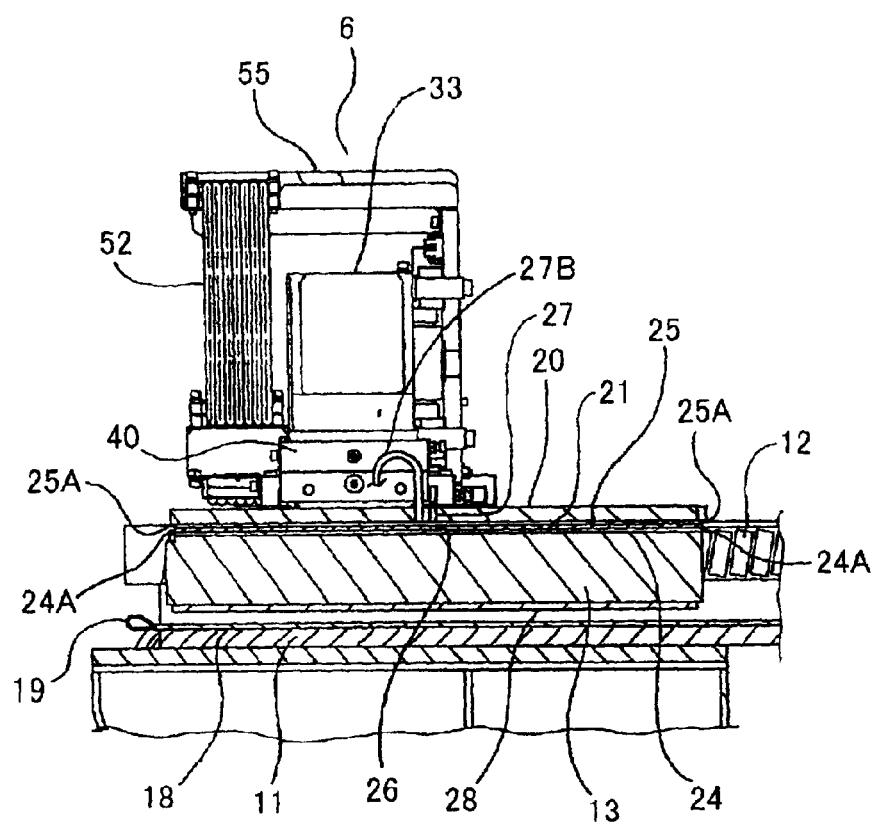
FIG. 5 is a partial enlarged view of FIG. 4. showing the beam portion.

Also, as shown in FIG. 3, on an upper surface of the bottom wall 11, a thermal conduction portion 18, with the same configuration as that of the thermal conduction portion 16, is provided. The thermal conduction portion 18 is divided into front and rear parts and placed along the longitudinal direction covering almost the entire surface of the guide 8 using, for example, the high thermal conductivity adhesives. As shown in FIGS. 4 and 5, at the front or rear end of the thermal conduction portion 18, a bent portion 19 is provided expanding in the lateral direction at a location outside of the range of movement of the movable element 13.

Reference numeral 20 represents a base made of, for example, aluminum, formed at a lower portion of the right and left ends of the beam 6. The movable element 13 is attached to the lower surface of the base 20 with a heat-insulating portion 21 between them. Also, the coefficient of linear thermal expansion of the base 20 is larger than that of the movable element 13, which is mainly made of iron. Here, a coefficient of linear thermal expansion means a linear expansion of a unit length of an object under a unit increase of the temperature.

The heat-insulating portion 21 comprises resin made mainly of glass fiber with a small thermal conductivity. On the surface of the heat-insulating portion 21, contacting with the movable element 13 and the base 20, a plurality of ditches 22, 23 are formed in the longitudinal direction. In the space between the ditches 22, 23 and the upper surface of the movable element 13 as well as between the ditches 22, 23 and the lower surface of the base 20, air passages 24, 25 are formed, respectively. These air passages 24, 25 are formed from the front end to the rear end of the heat-insulating portion 21. As shown in FIG. 5, at front and rear ends of the air passages 24, 25, air exhausting holes 24A and 25A are also formed.

Figure 6:
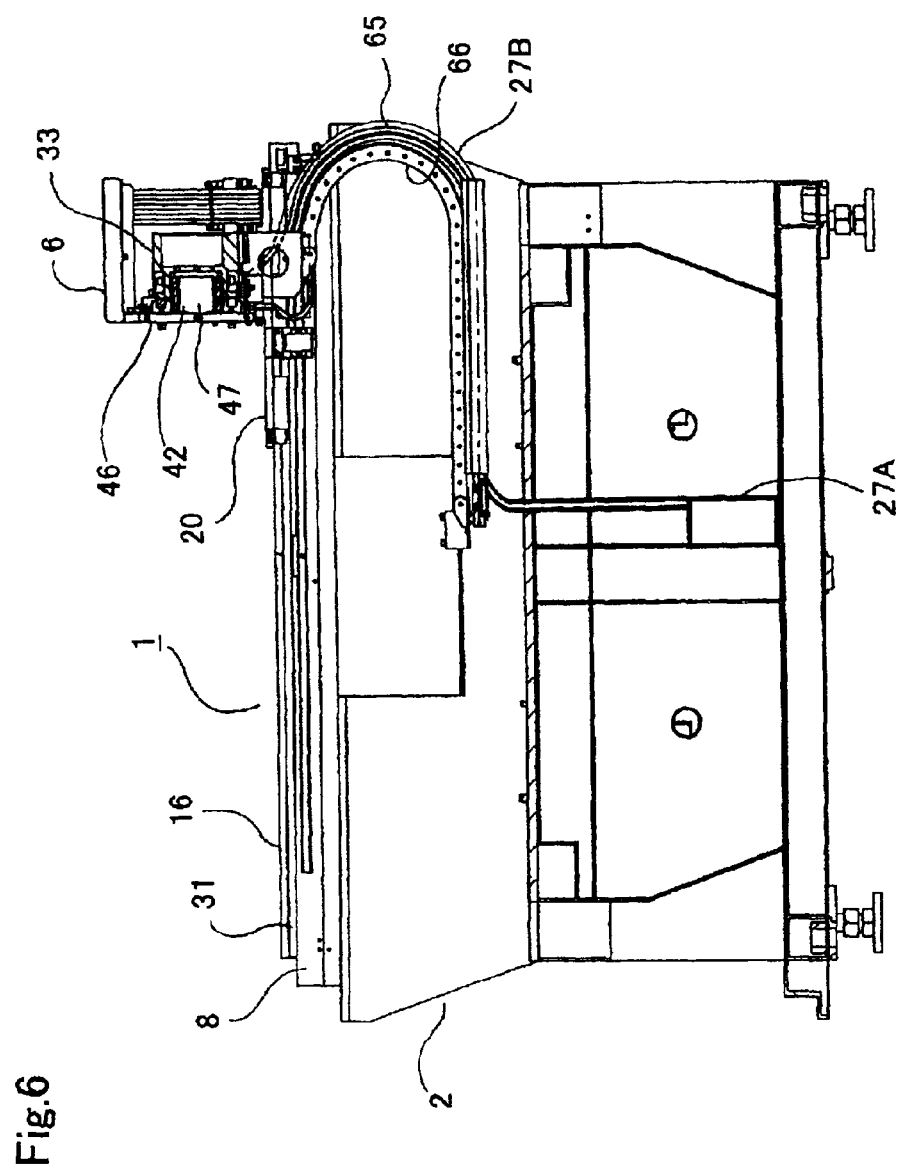
FIG. 6 is a schematic view of the cross-section of the electronic component mounting apparatus of FIG. 1 cut along the C—C line.

Additionally, at approximately the center of the heat-insulating portion 21, a passage 26, connecting the air passage 24 and the air passage 25 is formed. Reference numeral 27 denotes an air supply passage formed in the base 20 for supplying air to the air passage 24 and the air passage 25 for cooling. As shown in FIGS. 4, 5 and 6, an air supply source (air supply mechanism, a fan or a pump) 27A is vided on the component mounting apparatus itself and sends air to the air supply passage 27 through a tube 27B, and then supplies air to the air passages 24, 25.

As shown in FIGS. 3 and 5, reference numeral 28 denotes a heat radiation portion formed on almost the entire lower surface of the movable element 13. The heat radiation portion 28 is made of, for example, aluminum, which has a good thermal conductivity, and has a plurality of fins 29 in the longitudinal direction of the movable element 13 (the Y-direction, which is the moving direction of the beam 6). There is a space used as an air passage between the fin 29 and the bottom wall 11 of the guide 8, as well as between the fin 29 and the thermal conduction portion 18.

Reference numeral 30 denotes a linear way for supporting and guiding the beam 6. The linear way 30 is fixed on an upper surface of a side part of the guide 8, and includes a rail 31, extending in the longitudinal direction of the guide 8, and a slider 32, corresponding to the rail 31, fixed on the bottom surface of the base 20. Also, the guides 8 and the Y-axis linear motors 7, on upper parts of right and left sides of the base 2 are symmetrically placed.

Next, the configuration of the beam 6 will be described by referring to FIGS. 4 and 7, in which the mounting heads are omitted. Reference numeral 33 is a beam main rail. The beam main rail 33 is horizontally placed and made of, for example, aluminum, which has a good thermal conductivity. The beam main rail 33 includes an upper wall 34 and a lower wall 35, which are connected by a vertical wall 36. Between a front upper wall 37 and a front lower wall 38, which are located in front of the vertical wall 36, another movable element in the beam, described later, is placed. A plurality of openings 39 are formed as air passages at suitable locations on the vertical wall 36. The base 20 supports the right and left ends of the beam main rail 33 with a metal supporting portion 40.

Figure 7:
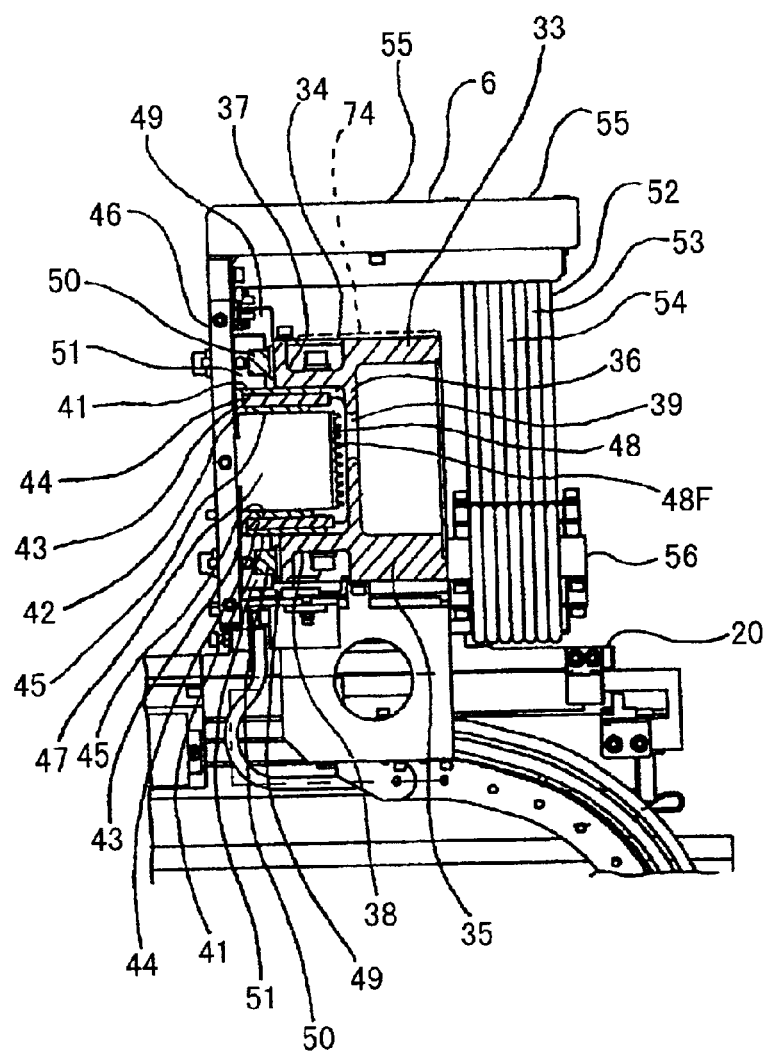
FIG. 7 is a partial enlarged view of FIG. 6 showing the beam portion.

As shown in FIGS. 3 and 7, reference numeral 41 indicates a thermal conduction portion in the beam 6 with a high thermal conductivity, and has the same configuration as that of thermal conduction portions 16, 18. The thermal conduction portion 41 is divided in two and placed on the respective inside surfaces of the front upper wall 37 and the front lower wall 38, which face each other, using, for example, a high thermal conductivity adhesive.

Furthermore, the thermal conduction portion 41 is attached to a base 44 of the fixed element 43. The fixed element 43 and a movable element, which will be described later, work as an X-axis linear motor 42. Thermal conduction portion 41 is attached to the fixed element 43, using for example, a high thermal conductivity adhesive. At the right or left end of each of the thermal conduction portions 41, a bent portion 71 is placed. At the inside surface of the base 44, magnets 45, 45 of the fixed element 43 are placed facing each other. Also, the thermal conduction portion 41, base 44, and the magnet 45 are formed extruding from the front upper wall 37 and the front lower wall 38.

Reference numeral 46 is a head base on which a mounting head is placed. On a back surface of the head base 46, a movable element 47 of the X-axis linear motor 42 is mounted. There is a small space between the magnets 45, 45 and the upper surface as well as the lower surface of the movable element 47. Also, on the back surface of the movable element 47, a heat radiation portion 48 with a good thermal conductivity made of, for example, aluminum is placed facing the vertical wall 36 with a space between them. The heat radiation portion 48 is placed to cover almost the whole width of the back surface of the movable element 47. On the surface of the heat radiation portion 48, a plurality of fins 48F are formed in the longitudinal direction (horizontal direction).

Reference numerals 49, 49 include a linear way for horizontally guiding the head base 46. The linear ways 49, 49 comprise a rail 50 fixed on the upper and lower front end of the beam main rail 33 and a slider 51 fixed on the back surface of the base 46 corresponding to the rail 50.

Reference numeral 52 indicates a flat cable, in which cables 53 and air tubes 54 for the mounting head, are arranged and bundled together with adhesives. The flat cable 52 is formed at the rear portion of the beam main rail 33. Reference numeral 55 is a head canopy placed at the upper end of the head base 46. The head canopy 55 supports the upper side of the air tube 54. A supporting portion 56 placed at the back surface of the beam main rail 33 supports the lower side of the air tube 54.

Next, the mounting head will be described by referring to FIG. 8.

Figure 8:
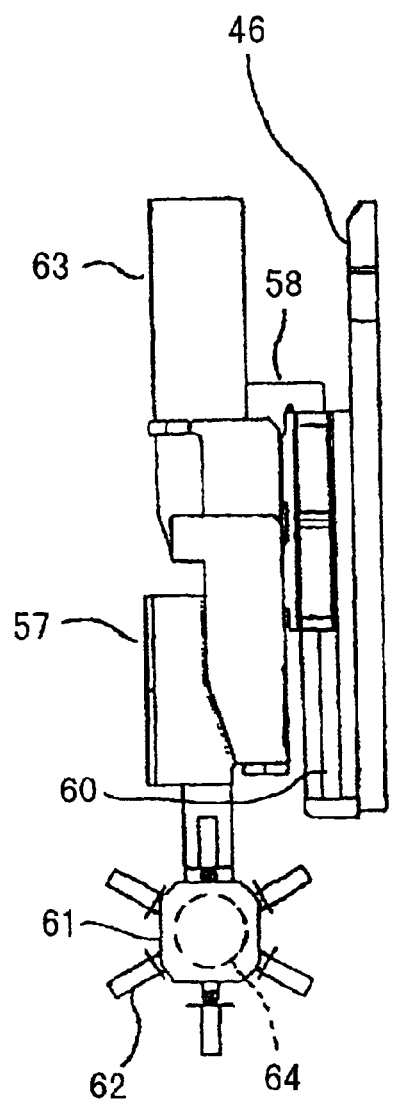
FIG. 8 is a side view of the mounting head of the embodiment of this invention.

As shown in FIG. 8, on the head base 46, a mounting head 57 is placed in such a way that the mounting head 57 can move up and down by the vertical axis motor 58 along a guide 60. Also, on a nozzle-placing component 61 of the mounting head 57, six suction nozzles are mounted with an equal space among them. The nozzle-placing component 61 can rotate around a vertical axis by a θ-axis motor 63. Furthermore, a nozzle selection motor 64 selects an arbitrary suction nozzle 62 out of the six suction nozzles and rotates the selected nozzle so that the suction end of the selected nozzle faces down.

Therefore, the mounting head 57 and the suction nozzle 62 can move in both X and Y directions by driving the X-axis linear motor 42 and the Y-axis linear motor 7, respectively. Also, the suction nozzle 62 can rotate around the vertical axis and move upwards and downwards. On the head bases 46 at both right and left side, the mounting heads 57 are placed.

Also, as seen from FIG. 6, reference numerals 65, 65 indicate Y-direction flat cable formed in Y direction inside of the guides 8, 8. The flat cable 65 is supported by a cable-veyer 66.

Next, the operation of the mounting apparatus with above configuration will be explained. First, a print board P is sent from an upper stream apparatus by a conveyer (not shown) to the positioning portion 4 through the supply conveyer 3. Then the print board P is positioned by the positioning mechanism (not shown).

Next, according to the mounting data stored in the memory device (not shown) about the X and Y coordinates and the rotating angle of the print board P as well as the location number of the component supply unit, the suction nozzle 62, which is suitable for a certain kind of electronic component, picks up an electronic component by suction from a certain component supply unit in accordance with the mounting order.

That is, the beam 6 moves along the guides 8 in Y direction by driving the Y-axis linear motor 7. And the mounting head 57 moves in X direction by driving the X-axis linear motor 20 without colliding with other mounting heads and sequentially moves to a space above the component supply unit that stores the electronic component to be picked up.

As shown in FIG. 8, the supply unit has already been driven to the certain position so that the component can be picked up at the component suction position. Thus, the suction nozzle 62 selected by the selection motor 64 of one of the mounting heads 57, moves downwards by driving the vertical axis motor 58 for picking up the electronic component by suction. Then, this suction nozzle 62 moves upwards and the suction nozzle 62 of the other mounting head 57 moves to a space above the component supply unit, which stores the electronic component to be picked up next. Likewise, this suction nozzle 62 moves downwards to pick up the electronic component by suction.

Then, as described before, the mounting head 57 moves horizontally to a space above the print board P on the positioning portion 4. Then, each of the suction nozzles 62 of the each of the mounting heads 57 moves downwards for mounting the electronic component to the print board P.

Also, as shown in FIG. 8, when each of the mounting heads 57 (head base 46) moves in X direction along the guide 8 by driving the X-axis linear motor 42, the flat cable 53 can be easily bent. When the beam 6 moves in Y direction along the guide 8 by the Y-axis linear motor 7, the cable-veyer 66, holding the Y-direction flat cable 65, can be also bent. Therefore, the mounting head 57 and the beam 6 can move smoothly, as shown in FIG. 6.

As shown in FIG. 3, the movable element 13 generates heat because of the operation of the Y-axis linear motor 7. The apparatus has a heat-insulating portion 21, with a little thermal conductivity between the movable element 13 and the bases 20, 20, located at right and left lower parts of the beam 6. This simple configuration can prevent the temperature of the movable element 13 from increasing. Also, the heat-insulating portion 21 can lower the thermal conduction from the movable elements 13, 13 to the bases 20, 20 of the beam during operation of the beam 6.

As shown in FIG. 5, furthermore, cooling air from an air supply source goes through the air supply passage 27 formed in the heat-insulating portion 21. Then, the air enters the central part of the air passage 25 formed at the side of the base 20 and goes through the passage. Then, it comes out from the air exhausting holes 25A located at both ends. While the air goes through the air passage 25, it takes the heat away from the heat-insulating portion 21 and the base 20, which surround the passage. The air coming from the air supply passage 27 enters the central part of the air passage 24 through the central part of the air passage 25 and the passage 26. Then, the air comes out from the air exhausting holes 24A located at both ends. While the air goes through the air passage 24, it takes the heat away from the heat-insulating portion 21 and a part of the base 20 connected to the movable element 13, which has a higher temperature than the other part of the base. Then, the heat is radiated outside.

As a result, a temperature increase in the heat-insulating portion 21 itself as well as the thermal conduction from the movable element 13 to the base 20 can be minimized. Also, the thermal deformation (linear thermal expansion) of the base 20 of the beam 6 can be suppressed. Furthermore, the air from the air supply mechanism goes from the ditch 25 located at the side of the base 20, to the ditch 24, located at the side of the movable element 13. Therefore, the cooler air first goes through the ditch located at the side of the base 20, further suppressing the temperature increase of the base 20, preventing thermal deformation of the base 20.

Additionally, thermal conduction to the beam main rail 33 supported by the base 20 through the supporting portion 40 can also be suppressed, leading to the minimization of the thermal deformation of the beam main rail 33. Furthermore, thermal deformation can be avoided by preventing a partial temperature increase of the base 20. This leads to improved accuracy of the positioning during the electronic component mounting operation.

Also, since the coefficient of linear thermal expansion of the base 20 and the beam main rail 33 is larger than that of movable element 13, the thermal deformation of the base 20 and the beam main rail 33 due to the temperature difference between the base 20 and the movable element 13, as well as the difference between the beam main rail 33 and the movable element 13. Note that the temperature of the movable element 13 is higher than the temperatures of the base 20 and the beam mail rail 33.

As shown in FIG. 3, due to operation of the Y-axis linear motor 7 for the component mounting operation, the movable element 13 generates heat and this heat increases the temperature of the pair of the fixed elements 12, 12. However, the thermal conduction portions 16, 16 are placed on the outer surface of the fixed elements 12, 12 extending almost the whole width of its longitudinal direction. Thus, the heat in the fixed elements 12, 12 is transmitted to the thermal conduction portions 16, 16. The thermal conduction portions 16, 16 have a high thermal conductivity and, thus, transmit the heat in a short period of time. Therefore, a temperature increase of the fixed elements 12, 12, especially, a partial temperature increase of the base 14, can be prevented. That is, during operation of the mounting apparatus 1, the temperature increase at the central part of the base 14 of the fixed elements 12, 12 (the partial temperature increase), which correspond to the central part of the apparatus where the beam 6 frequently moves, can be prevented. The temperature can be approximately kept constant in the whole area of the fixed elements 12, 12.

Accordingly, partial thermal deformation of the fixed elements 12, 12, especially, of the base 14, can be avoided. Also, the heat in the guide 8 is transmitted to the thermal conduction portions 16, 16, preventing a partial temperature increase and avoiding thermal deformation of the guide 8.

Even when the fixed element 12 and the side wall 10 located at the left side of the movable element 13 are partially heated by the movable element 13, the heat is transmitted through the inside thermal conduction portion 16 along its longitudinal direction (the thermal conduction portion of the left side in FIG. 3). The conduction portion 16 is partially sandwiched between the side wall 10 the guide 8 and the fixed element 12. Thus, a partial temperature increase of the fixed element 12 and the side wall 10 can be avoided, preventing the partial thermal deformation of the guide 8. An aberration in the scale formed in the side wall 10 in the longitudinal direction can also be avoided, thereby preventing the deterioration of the positioning accuracy of the electronic component mounting operation due to thermal deformation.

Also, the heat transmitted to the guide 8 due to the thermal conduction from the fixed element 12 or the radiation from the movable element 13 is then transmitted to the thermal conduction portion 18 formed on the bottom wall 11. The thermal conduction portion 18, which includes the part formed near the movable element 13 and the other part exposed openly in the air, transmits and radiates heat rapidly. Therefore, a partial temperature increase as well as the thermal deformation of the guide 8 can be avoided.

The heat generated in the movable element 13 is also transmitted to and radiated from the heat radiation portion 28 located at the lower surface. Since the heat radiation portion 28 has a plurality of fins 29, making the radiating area and the radiating rate larger, it can prevent a temperature increase of the movable element 13. Additionally, as the beam 6 moves in Y direction, air goes through the fin 29, the guide 8, the bottom wall 11 and the thermal conduction portion 18, further facilitating heat radiation. Accordingly, a temperature increase in the movable element 13 is minimized, leading to suppression of a partial temperature increase and a partial thermal deformation of the guide 8 due to the heat generated in the movable element 13. This leads to an improved positioning accuracy of the electronic component mounting operation.

As shown in FIG. 7, furthermore, due to the operation of the X-axis linear motor 42 during the movement of the beam 6, the movable element 47 generates heat and this heat increases the temperature of the pair of fixed elements 43, 43. However, the thermal conduction portions 41, 41, which are placed in the beam main rail 33, are formed on the outer surface of the fixed elements 43, 43 extending almost the whole width of the longitudinal direction. Thus, heat in the fixed elements 43, 43 is transmitted to the thermal conduction portions 41, 41. The thermal conduction portions 41, 41 have a high thermal conductivity and thus radiate the heat in a short period of time. Therefore, a temperature increase of the fixed elements 43, 43 can be effectively suppressed. That is, during the operation of the mounting apparatus 1, a temperature increase at the central part of the fixed elements 43, 43, which correspond to the central part of the beam 6 where the mounting head 57 frequently moves, can be prevented. The temperature can be approximately kept constant in the whole area of the fixed elements 12, 12. As a result, the thermal deformation of fixed elements 43, 43, especially that of the bases 44, 44, can be avoided.

Also, because of the thermal radiation from the entire area of the thermal conduction portions 42, 42, a temperature increase of the entire area or the part of the beam main rail 33 is suppressed, avoiding thermal deformation of the beam main rail 33.

The heat generated in the movable element 47 is also transmitted to and radiated from the heat radiation portion 48 located at the backside. Since the heat radiation portion 48 has a plurality of fins 48F, making the radiating area and the radiating rate larger, it can prevent a temperature increase in the movable element 47. Additionally, as the mounting head 57 moves in the X direction, the air goes through the fin 48F, further facilitating heat radiation. Accordingly, a temperature increase in the movable element 47 is minimized.

Additionally, the heated air surrounding the fin 48F goes out of the opening 39, further facilitating the radiation of the fin 48F. This leads to an improved radiation effect of the fin 48F. Thus, the partial temperature increase and partial thermal deformation of the beam main rail 33 due to the heat in the movable element 47 can be minimized, improving positioning accuracy during the electronic component mounting operation.

In the above embodiment, the ditches 22, 23 are formed in the heat-insulating portion 21. The air from the air supply mechanism goes through to the air passages 24, 25, formed between the movable element 13 and the base 20. However, it is also possible to let the air go through the ditches 22, 23 without using the air supply mechanism as the beam 6 moves.

Also, it is also possible to independently form a plurality of ditches with no air circulation on the surface of the heat-insulating portion 21 contacting the movable element 13 or the base 20. In this case, each of the ditches functions as a heat-insulating material. Also the contacting area of the heat-insulating portion 21, with the movable element 13 or the base 20, can be minimized because of the presence of the ditches, suppressing thermal conduction from the movable element 13 to the base 20. As a result, a temperature increase of the base 20 can be suppressed.

Furthermore, instead of forming a plurality of ditches on the heat-insulating portion 21, a plurality of holes can be formed on the surface of the heat-insulating portion 21 contacting with movable element 13 or the base 20. These holes can function as heat-insulating material, as in the case of the ditches. The contacting area of the heat-insulating portion 21 with the movable element 13 or the base 20, can be minimized because of the presence of the holes, suppressing the thermal conduction from the movable element 13 to the base 20. As a result, the temperature increase of the base 20 can be suppressed.

Also, when a plurality of ditches or a plurality of holes are formed on the surface of the heat-insulating portion 21 contacting with the movable element 13 or the base 20, the same effect can be obtained. That is, these holes or ditches can function as a heat-insulating material. And the contacting area of the heat-insulating portion 21 with the movable element 13 or the base 20 can be minimized because of the presence of the holes or the ditches, suppressing the thermal conduction from the movable element 13 to the base 20.

As shown by the broken line in FIG. 3, on almost the entire side surface in the longitudinal direction of the guide 8, the thermal conduction portion 70, which is made of a material with a high thermal conductivity, such as aluminum and copper, or the heat lane board described above, is placed. The thermal conductivity of the thermal conduction portion 70 is higher than that of iron, from which the guide 8 is made. The thermal conduction portion 70 is placed on the surface of the guide 8 using, for example, high thermal conductivity adhesives.

Also, between the thermal conduction portion 70 and the guide 8, for example, a grease with a high thermal conductivity can be placed for improving the overall thermal conductivity. Then, the thermal conduction portion can be placed on the guide 8 by using a long metal board. Since the thermal conduction portion 70 is placed on the side surface of the guide 8, the heat transmitted to the thermal conduction portion 70, especially the heat from the central part of the guide 8 heated by the radiation from the movable element 13 or the heated surrounding air, is radiated from the entire area of the thermal conduction portion 70 in a short period of time. When a heat lane is used for the thermal conduction portion 70, the heat is transmitted and radiated very quickly.

Therefore, the partial temperature increase of the guide 8 can be suppressed, preventing the thermal deformation of the guide 8. The thermal conduction portion 16 and the thermal conduction portion 70 can be formed as one component.

Also as shown by the broken line in FIG. 7, when the heat lane is used as the thermal conduction portion 74, as in the case of the guide 8, which covers almost the entire upper surface of the beam main rail 33 and has a higher thermal conductivity than that of the beam main rail 33. The heat transmitted from the beam main rail 33 to the thermal conduction portion 74 is rapidly transmitted to the entire area of the thermal conduction portion 74 and rapidly radiated. Therefore, the partial temperature increase of the beam main rail 33 can be suppressed, effectively avoiding thermal deformation of the beam main rail 33.

Instead of the thermal conduction portion 70 indicated by the broken line in FIG. 3, the heat radiation portion having a plurality of fins, which are made of materials of higher thermal conductivity than the guide 8, covers almost the entire side surface of the guide 8 in the longitudinal direction. The materials used include aluminum and copper. Since the heat radiation portion is formed on the side surface of the guide 8, the heat transmitted to the heat radiation portion is radiated from the heat radiation portion. Thus, the heat transmitted to the entire area of the heat radiation portion is radiated from the entire area of the heat radiation portion. Accordingly, the partial temperature increase and partial thermal deformation of the guide 8 can be prevented. Also, by placing the additional heat radiation portion inside of the guide 8, the heat radiation from the guide 8 can be further facilitated and a partial temperature increase of the guide 8 is further suppressed.

Instead of the thermal conduction portion 74 indicated by the broken line in FIG. 7, as in the case of the guide 8 described above, the heat radiation portion having a plurality of fins with higher thermal conductivity can also be placed on the upper wall 34 of the beam main rail 33. In this case, the movable element 47 generates heat as the mounting head 57 moves. However, the heat transmitted to the heat radiation portion from the beam main rail 33, which is partially heated, is radiated from the heat radiation portion. Then, the heat transmitted to the entire area of the heat radiation portion is radiated from the entire area of the heat radiation portion. Thus, the partial temperature increase as well as the partial thermal deformation of the beam main rail 33 can be prevented.

As described above, according to this invention, the heat-insulting portion can suppress the thermal conduction from the movable element to the beam during the beam movement. As a result, the thermal deformation of the beam can be minimized, leading to an improvement in positioning accuracy during the electronic component mounting operation.

Since the coefficient of linear thermal expansion of the beam is larger then that of the movable element, the thermal deformation of the beam due to the temperature difference between the beam at a lower temperature and the movable element at a higher temperature can be suppressed.

Also, since a plurality of ditches or a plurality of holes are formed on the surface of the heat-insulating portion contacting with the movable element and/or the beam, these holes or ditches can function as a heat-insulating material. And the contacting area of the heat-insulating portion 21 with the movable element or the beam can be minimized because of the presence of the holes or the ditches, suppressing the thermal conduction from the movable element to the beam, avoiding the thermal deformation of the beam.

Also, a plurality of ditches as air exhausting openings are formed in the heat-insulating portion. The air supplied to the ditches from the air supply mechanism takes the heat away from the heat-insulating portion, and then comes out from the air-exhausting opening. Thus, the temperature increase of the heat-insulating portion itself can be suppressed, minimizing the thermal conduction from the movable element to the beam. Thermal deformation of the beam is further prevented.

Additionally, in the heat-insulating portion, the passage, which connects the ditches formed on the surface of the heat-insulating portion contacting with the movable element and the ditches formed on the surface of the heat-insulating portion contacting with the beam, is formed. The air supply mechanism sends the air from the ditches on the beam side to the ditches on the movable element side through the passage mentioned above. Thus, cooler air first comes to the ditches on the beam side, suppressing the temperature increase of the beam. Therefore, the thermal deformation of the beam can be minimized.

According to this invention, a thermal conduction portion with the higher thermal conductivity than that of the beam is placed on the beam. Therefore, during the operation of the mounting head on the beam, the heat in the movable element of the mounting head is transmitted from the movable element of the mounting head to the beam. The heat is then transmitted to the longitudinal direction of the beam through the thermal conduction portion in a short period of time, thereby preventing the partial temperature increase as well as the thermal deformation of the beam. As a result, the cooling mechanism for the beam and its maintenance is simplified, and at the same time, the positioning accuracy of the electronic component mounting operation is improved.

The beam has an upper wall and a lower wall, which are horizontally formed along the beam. The fixed element are placed on the inside surfaces and the movable element is placed between the walls. The thermal conduction portion is formed between the fixed element and the upper wall, and between the fixed element and the lower wall in the longitudinal direction of the fixed element. Therefore, during the operation of the mounting head, the heat transmitted from the movable element of the mounting head to the fixed element is then transmitted rapidly to the upper and lower walls of the beam in the longitudinal direction through the thermal conduction portion. Thus, the partial temperature increase of the upper and lower walls can be prevented. Furthermore, heat is radiated from the upper and lower walls as well as the thermal conduction portion, minimizing thermal deformation of the beam with the fixed element. As a result, the positioning accuracy of the electronic component mounting operation can be improved.

Additionally, the thermal conduction portion is the heat lane board formed in the longitudinal direction of the fixed element contacting with the surface of the fixed element. Therefore, during the drive of the mounting head, the heat transmitted from the movable element of the mounting head to the fixed element is then transmitted to the beam in the longitudinal direction through the heat lane rapidly. Thus, the partial temperature increase of the beam can be prevented. Furthermore, the heat is radiated from the beam and the heat lane, further minimizing the thermal deformation of the beam with the fixed element. As a result, the positioning accuracy of the electronic component mounting operation can be further improved.

Also, according to this invention, the thermal conduction potion with the higher thermal conductivity than that of the fixed element is placed on the fixed element of the linear motor for driving the beam, which has the fixed element formed on the guide and the movable element formed on the beam. During the beam operation, the heat in the movable element of the linear motor is transmitted from the movable element to the fixed element or the guide through the radiation or the heated surrounding air. However, the heat is then transmitted to the fixed element in the longitudinal direction through the thermal conduction portion in a short period of time. Therefore, the partial temperature increase of the fixed element and the partial thermal deformation of the fixed element or the guide can be minimized, leading to the improved positioning accuracy of the electronic component mounting operation.

According to this invention, the thermal conduction potion with the higher thermal conductivity than that of the fixed element and the guide is placed on the surface of the fixed element of the linear motor, which moves the beam, and also on the surface of the side wall of the guide. During the beam movement, the heat in the movable element of the linear motor is transmitted from the movable element to the fixed element or the guide through the radiation or the heated air nearby. However, the heat is then transmitted quickly to the fixed element and the guide in the longitudinal direction through the thermal conduction portion. Therefore, the partial temperature increase of the fixed element and the guide can be avoided, minimizing the partial thermal deformation of the fixed element or the guide. As a result, the positioning accuracy of the electronic component mounting operation is improved.

Also, according to this invention, the thermal conduction potion with the higher thermal conductivity than that of the guide is placed on the upper surface of the bottom wall of the guide located at the lower part of the movable element of the linear motor, which drives the beam. The heat transmitted by the thermal conduction from the fixed element and the radiation from the movable element is then transmitted to the thermal conduction portion. The heat is further transmitted rapidly to and radiated quickly from the entire area of the thermal conduction portion, which includes the part formed near the movable element and the other part exposed openly in the air. Therefore, the partial temperature increase of the guide and the partial thermal deformation of the guide can be minimized.

Additionally, the thermal conduction portion is the heat lane board formed on the fixed element and the guide in the longitudinal direction. Therefore, during the movement of the beam, the heat transmitted from the movable element of the linear motor to the fixed element and the guide is then transmitted to the fixed element and the guide in the longitudinal direction through the heat lane in a short period of time. Thus, the partial temperature increase of the fixed element and the guides can be prevented. Furthermore, heat is radiated from the entire area in the longitudinal direction of the fixed element and the guides, effectively avoiding the thermal deformation of the fixed element or the guides. As a result, the positioning accuracy of the electronic component mounting operation can be further improved.

Furthermore, according to this invention, the heat radiation portion having a plurality of fins is formed in the longitudinal direction of the movable element of the linear motor, which drives the beam. During the movement of the beam, the heat in the movable element of the linear motor is radiated from the heat radiation portion, whose radiation area is increased by the presence of the fins. The temperature increase of the movable element can be suppressed, leading to the minimization of the partial temperature increase and thermal deformation of the guide. As a result, the positioning accuracy of the electronic component mounting operation is improved.

The heat radiation portion, which is formed with a space against the guides, and which has a plurality of fins in the direction of beam movement, is formed in the longitudinal direction on the bottom surface of the movable element of the linear motor, which drives the beam. During the movement of the beam, air goes around the fins, between guides and the bottom wall, facilitating the radiation. As a result, the temperature increase of the movable element is further suppressed. Therefore, the partial temperature increase and partial thermal deformation of the guide can be minimized, leading to the improved positioning accuracy of the electronic component mounting operation.

Also, the heat radiation portion with a plurality of fins is formed on the surface of the guide. The heat transmitted to the heat radiation portion from the radiation of the movable element or from the guide heated by the surrounding heated air is then radiated from the heat radiation portion. Furthermore, the heat transmitted to the entire area of the heat radiation portion is radiated from the entire area of the heat radiation portion. Therefore, the partial temperature increase and the partial thermal deformation of the guide can be prevented.

Additionally, the heat radiation portion with a plurality of fins is formed in the moving direction of the mounting head on the movable element of the linear motor formed on the mounting head. The heat generated in the movable element is transmitted to and radiated from the heat radiation portion, whose radiation area is increased by the presence of the fins. The temperature increase of the movable element can be suppressed, leading to the minimization of the partial temperature increase and the thermal deformation of the beam. As a result, the positioning accuracy of the electronic component mounting operation is improved.

The beam has the upper wall and the lower wall with a space between them. The walls are horizontally formed along the longitudinal direction of the beam, and the movable element is placed between them. The beam also has the vertical wall connecting the upper and lower walls with the opening. The movable element is formed in the space between the upper and lower walls facing to the vertical wall. The thermal conduction portion is formed on the back surface of the movable element facing the vertical wall. Therefore, as the mounting head moves, air goes around the fins, further facilitating the heat radiation, leading to the suppression of a temperature increase of the movable element.

Also, the heated air around the fin goes out of the opening, facilitating the heat radiation of the fin. The improved radiation effect of the fin can further suppress a partial temperature increase and partial thermal deformation of the beam due to the generated heat in the movable element, leading to improvement in the positioning accuracy of the electronic component mounting apparatus.

Additionally, the heat radiation portion with a plurality of fins is formed on the surface of the beam in the longitudinal direction. The heat transmitted from the beam to the heat radiation portion is then radiated from the heat radiation portion. Furthermore, the heat transmitted to the entire area of the heat radiation portion is then radiated from the entire area of the heat radiation portion. Therefore, the partial temperature increase and partial thermal deformation of the beam can be prevented.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. An electronic component mounting apparatus comprising:
   a pair of guides substantially parallel to each other;
   a beam for moving along the pair of guides;
   a mounting head slidably engaged with the beam so as to move in a longitudinal direction of the beam;
   a suction nozzle attached to the mounting head for picking up an electronic component by vacuum suction and for mounting the electronic component on a print board;
   a linear motor comprising a fixed element attached to the guides and a movable element attached to the beam, the linear motor driving the beam; and
   a heat-insulating portion fixed between the beam and the movable element.

2. The electronic component mounting apparatus of claim 1, wherein a coefficient of linear thermal expansion of the beam is larger than a coefficient of linear thermal expansion of the movable element.

3. The electronic component mounting apparatus of claim 1 or 2, wherein a plurality of ditches or holes is formed on a surface of the heat-insulating portion in contact with the movable element, on a surface of the heat-insulating portion in contact with the beam, or on the surfaces of the heat-insulating portion in contact with both the movable element and the beam.

4. The electronic component mounting apparatus of claim 3, further comprising an air exhausting opening provided for the ditches of the heat-insulating portion and an air supply mechanism provided for sending air to the ditches.

5. The electronic component mounting apparatus of claim 4, further comprising a passage connecting the ditches formed on the surface of the heat-insulating portion in contact with the movable element and the ditches formed on the surface of the heat-insulating portion in contact with the beam, wherein the air supply mechanism sends air through the passage from the ditches formed on the surface of the heat-insulating portion in contact with the movable element to the ditches formed on the surface of the heat-insulating portion in contact with the beam.

6. The electronic component mounting apparatus of claim 1, further comprising a thermal conduction portion having a thermal conductivity higher than a thermal conductivity of the fixed element and of the guide;
   wherein a trench is formed in the guides having a side wall and a bottom wall, the fixed element is disposed along the guides so that the side wall and a face of the fixed element align to provide a substantially continuous surface, the movable element is positioned in the trench so that there is room for linear motor operation between the side wall and the movable element, between the bottom wall and the movable element and between the fixed element and the movable element, and
   wherein the thermal conduction portion is disposed in the direction of the guides on a surface of the fixed element or on the side wall.

7. The electronic component mounting apparatus of claim 1, further comprising a thermal conduction portion having a thermal conductivity higher than a thermal conductivity of the guides,
   wherein a trench is formed in the guides having a side wall and a bottom wall, the fixed element is disposed along the guides so that the side wall and a face of the fixed element align to provide a substantially continuous surface, the movable element is positioned in the trench so that there is room for linear motor operation between the side wall and the movable element, between the bottom wall and the movable element and between the fixed element and the movable element,
   wherein the thermal conduction portion is disposed on the bottom wall in the direction of the guides.

8. The electronic component mounting apparatus of claim 1, further comprising a first heat radiation portion having a plurality of fins formed in a direction of the guide,
   wherein a trench is formed in the guides having a side wall and a bottom wall, the fixed element is disposed along the guides so that the side wall and a face of the fixed element align to provide a substantially continuous surface, the movable element is positioned in the trench so that there is room for linear motor operation between the side wall and the movable element, between the bottom wall and the movable element and between the fixed element and the movable element; wherein the heat radiation portion is disposed on a bottom surface of the movable element in the direction of the guides.

* * * * *